United States Patent
Feng et al.

(12)

(10) Patent No.: US 6,944,064 B2
(45) Date of Patent: Sep. 13, 2005

(54) MEMORY UNIT HAVING PROGRAMMABLE DEVICE ID

(75) Inventors: Eugene Feng, San Jose, CA (US); Michael S. Briner, San Jose, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 0 days.

(21) Appl. No.: 10/744,504

(22) Filed: Dec. 22, 2003

(65) Prior Publication Data

US 2005/0135153 A1    Jun. 23, 2005

(51) Int. Cl.[7] ............................................. G11C 7/00
(52) U.S. Cl. ........................ 365/189.01; 365/185.33; 365/189.07
(58) Field of Search ........................ 365/100, 185.33, 365/189.01, 189.07, 189.12, 96, 51, 52, 63; 711/102, 103, 156

(56) References Cited

U.S. PATENT DOCUMENTS

| 5,619,453 | A | * | 4/1997 | Roohparvar et al. ... 365/185.33 |
| 5,991,841 | A |   | 11/1999 | Gafken et al. |
| 6,085,282 | A | * | 7/2000 | Hansen et al. ............... 711/103 |
| 6,330,635 | B1 |   | 12/2001 | Stafford |
| 6,366,521 | B1 | * | 4/2002 | Roohparvar ................. 365/226 |
| 6,421,765 | B1 |   | 7/2002 | Poisner |
| 6,820,179 | B2 | * | 11/2004 | Kobayashi et al. ......... 711/156 |

* cited by examiner

*Primary Examiner*—Gene N. Auduong
(74) *Attorney, Agent, or Firm*—DLA Piper Rudnick Gray Cary US LLP

(57) ABSTRACT

An integrated circuit memory device has a memory array and a non-volatile register for storing a stored signal. A bus is connected to the device for supplying an externally supplied signal to the device. A comparator compares the stored signal and the externally supplied signal and provides access to the memory array in response to the comparison.

22 Claims, 4 Drawing Sheets

LPC Memory Cycle Preamble

Firmware Memory Cycle Preamble

LPC and Firmware Memory Cycle Single Byte Read

LPC and Firmware Memory Cycle Single Byte Write

MEMORY UNIT HAVING PROGRAMMABLE DEVICE ID

TECHNICAL FIELD

The present invention relates to a memory unit having a programmable device ID and more particularly wherein the device ID serves as an address in an LPC compatible protocol.

BACKGROUND OF THE INVENTION

Computer systems are well known in the art. In particular, a computer system adhering to the "IBM PC" standard is well known in the art. Referring to FIG. 1, there is shown a computer system 10 of the prior art. The computer system 10 conforms to the "IBM PC" architecture. The system 10 comprises typically a motherboard 12 on which are mounted a variety of components such as a processor 14, such as a Pentium microprocessor made by Intel Corporation, a memory controller hub (MCH) chip 16, and a 10 controller hub (ICH) chip 18. The MCH 16 and the ICH 18 are known as chipsets and can be obtained from Intel Corporation. The motherboard 12 also comprises a non-volatile memory device 20 which is typically for storing main system BIOS. The MCH chip 16 also interfaces with or may be integrated with (i.e. embedded within) a graphics controller chip 62, which outputs its video signal to a video display port, typically a VGA port and to a video device (not shown), such as an LCD display or CRT display. The foregoing system is described and is disclosed in U.S. Pat. No. 6,421,765. See also U.S. Pat. No. 6,330,635.

Intel Corporation, a developer of the MCH chip 16, also developed the ICH chip 18 which has a particular feature known as a low pin count (LPC) bus. See, for example, U.S. Pat. No. 5,991,841. The ICH chip 18 has an LPC bus interface 19 which interfaces with an LPC bus 66, which communicates with the BIOS memory device 20. At the time that Intel Corporation introduced the LPC bus 66, it disclosed that the LPC bus 66 is operable in accordance with the standard as disclosed in FIG. 2. This is also disclosed in U.S. Pat. No. 5,991,841. The LPC bus 66 comprises four signal lines between the ICH chip 18 and the peripheral devices such as the BIOS memory device 20. Along the four signal lines, designated as LAD [3:0], are supplied address, data and control fields that are multiplexed. As shown in FIG. 2, the initial field for the LAD bus is a start field. This is then followed by the address, data and control fields. In addition, the LPC bus 66 has LCLK and LFRAME# control signals.

From time to time, a need arises for the ICH chip 18 through the LPC bus interface 19 to the bus 66 to interface with a plurality of BIOS memory chips 20. In the prior art, the manner of connecting a plurality of BIOS memory chips 20 to an LPC bus 66 is shown in FIG. 3. Since the bus 66 is the only bus that connects in common to all of the BIOS memory chips 20 and it supplies data fields, address fields, and control fields in common to all the chips 20, there must be a mechanism by which one BIOS chip 20 is distinguished from another. In the prior art this is accomplished by having each of the BIOS chips 20 having four additional pins which are "strapped", i.e., a common technique to tie down the pins to either VCC (a source of power supply) or VSS (ground). As shown in FIG. 3, for example, BIOS chip 20A has all four of its device ID pins connected to VSS, thereby creating the combination of "0000" bit pattern. Similarly, BIOS chip 20C has its four device ID pins connected to VSS, VSS, VCC, and VSS, creating a bit pattern of "0010". Finally, since there are four device pins, there is the possibility of the LPC bus 66 supporting up to 16 BIOS chips 20. Thus, the "last" device, BIOS chip 20P, has all of its four device pins connected to VCC, resulting in a bit pattern of "1111".

The use of the device pins in the prior art BIOS chips 20 poses at least two problems. First, four additional pins must be provided to each chip 20 thereby increasing the cost. This is also contrary to the philosophy of a "low pin count" bus. Second, the identification for each device cannot be known until it is actually mounted on the motherboard 12 and the device ID pins tied to specific voltages, either ground or VCC. Since the layout of the wiring of either ground or VCC on a motherboard 12 may already be set, it may be difficult to place additional BIOS chips 20 having the desired device ID.

SUMMARY OF THE INVENTION

Accordingly, in the present invention, an integrated circuit memory device comprises a memory array. The device also comprises a non-volatile register for storing a stored signal. A bus is connected to the device for supplying an externally supplied signal to the device. A comparator compares the stored signal and the externally supplied signal and provides access to the memory array in response to the comparison.

DETAILED DESCRIPTION OF THE INVENTION

Figure 1:
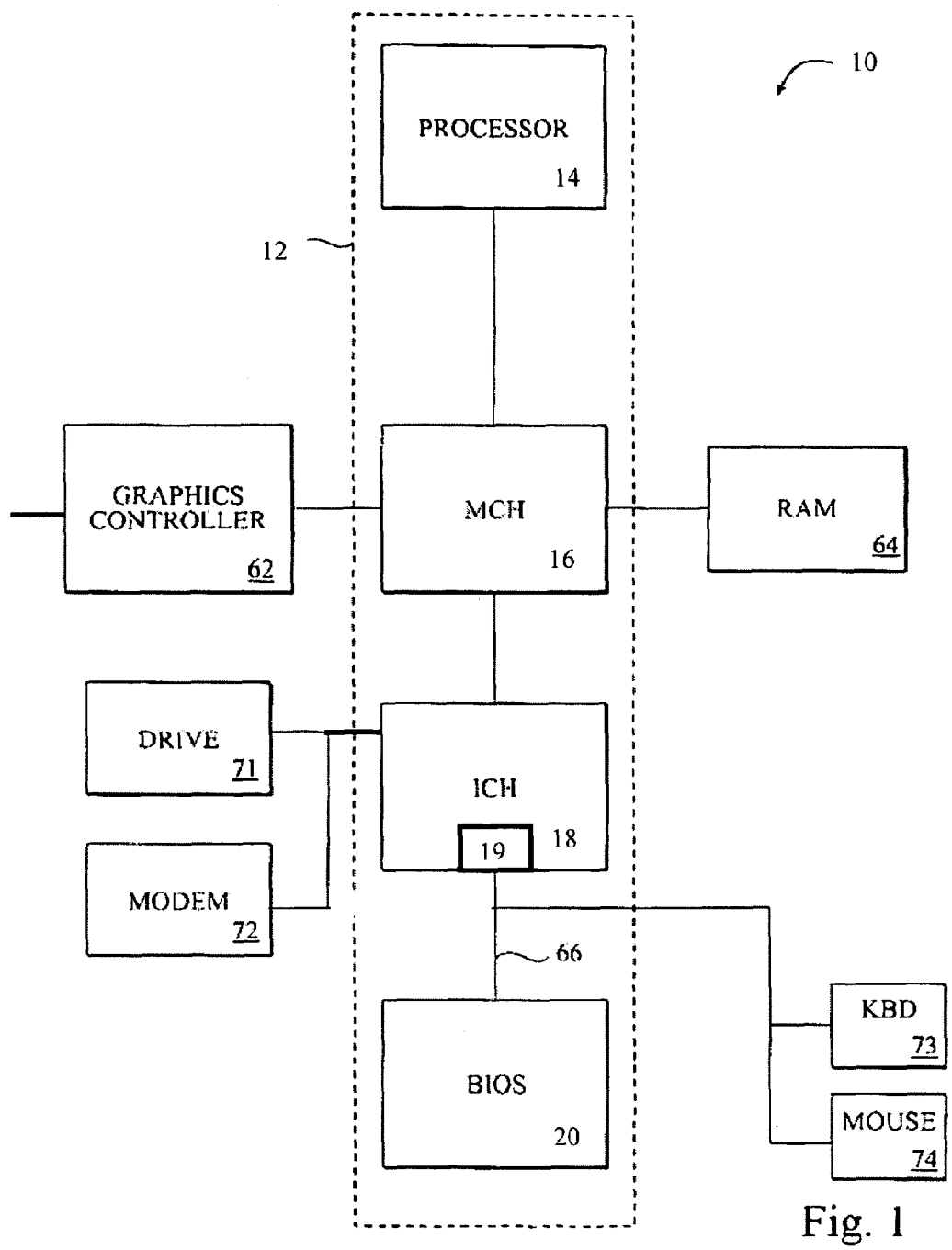
FIG. 1 is a block diagram view of a computer system in accordance with the "IBM PC" architecture of the prior art.
Figure 2:
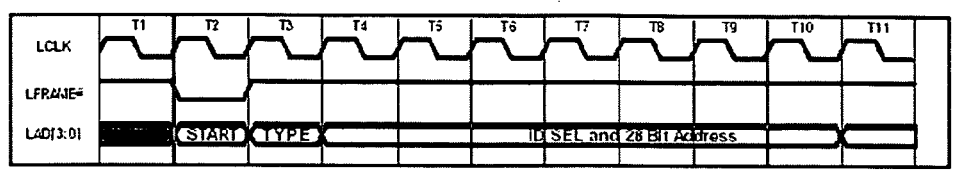
FIG. 2 are timing diagrams showing the protocol of communication between the ICH chip and the BIOS memory device of the prior art and the present invention in accordance with the LPC protocol of the prior art and the present invention.
Figure 2:
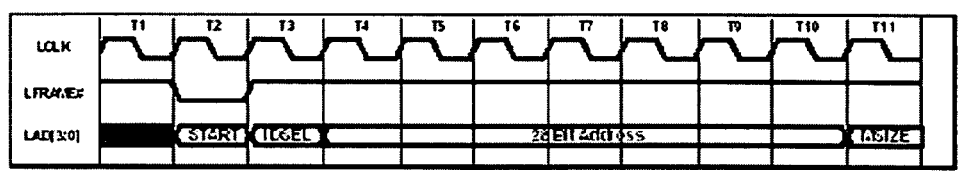
Figure 2:
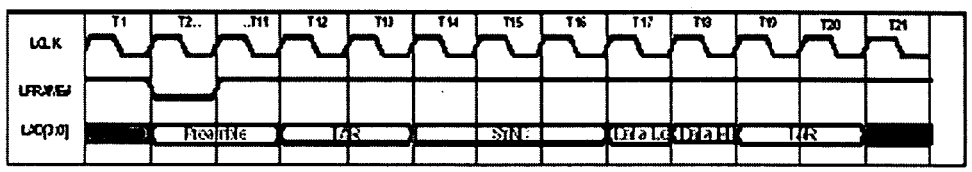
Figure 2:
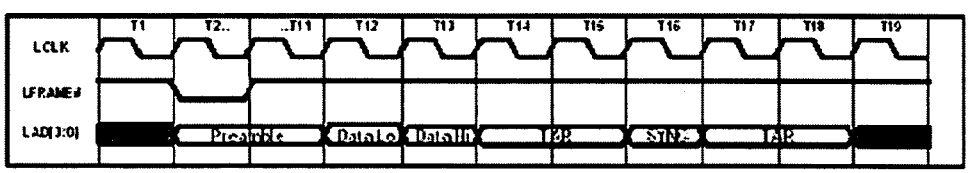
Figure 3:
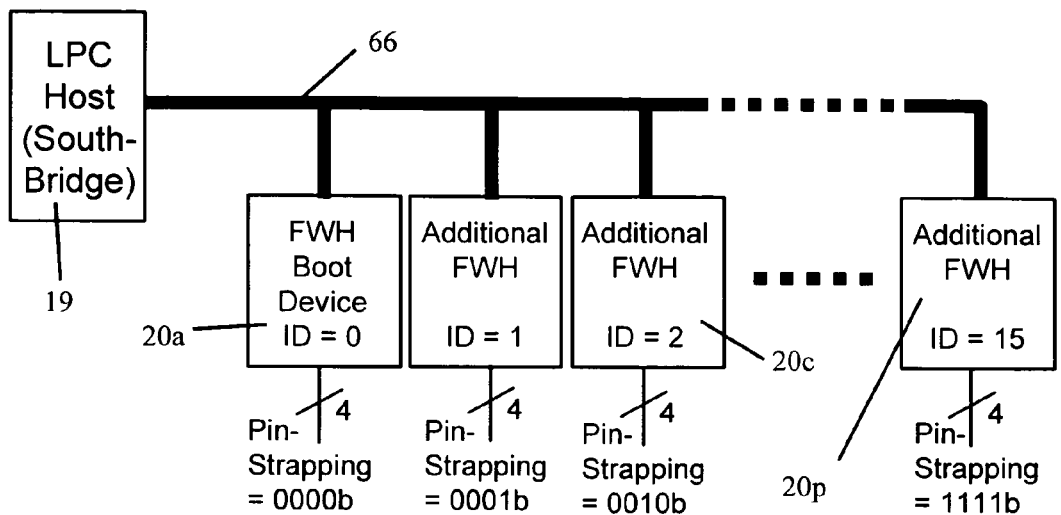
FIG. 3 is a block diagram view of an LPC interface connecting to an LPC bus connected to a plurality of BIOS memory devices of the prior art in accordance with the prior art wherein each BIOS memory device has a plurality of device pins that are strapped creating the device ID.
Figure 4:
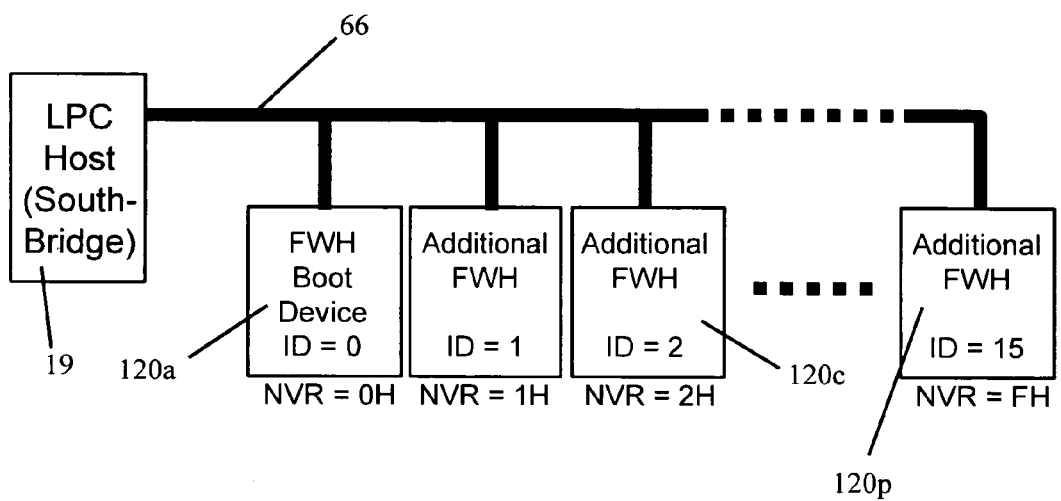
FIG. 4 is a block diagram view of a LPC interface connected to an LPC bus connecting to a plurality of BIOS memory devices of the present invention.

Referring to FIG. 4 there is shown a block diagram of an LPC interface 19 in an ICH chip 18 connected to an LPC bus 66. The bus 66 is connected in common to a plurality of improved BIOS memory devices 120 of the present invention. Each of the BIOS memory devices 120 is similar to the BIOS memory devices 20 of the prior art, with the exceptions as discussed hereinafter. A significant difference between the improved BIOS memory device 120 of the present invention and the BIOS memory device 20 of the prior art is that in the improved BIOS memory device 120 of the present invention there are no device ID pins. Thus, each of the improved BIOS memory devices 120 has fewer pins than the BIOS memory devices 20 of the prior art and accordingly is cheaper to manufacture. In addition, due to the flexibility in design of the improved BIOS memory device 120, as will be discussed hereinafter, the improved BIOS memory device 120 offers greater advantage and flexibility in designing and assembly into a motherboard 12.

Figure 5:
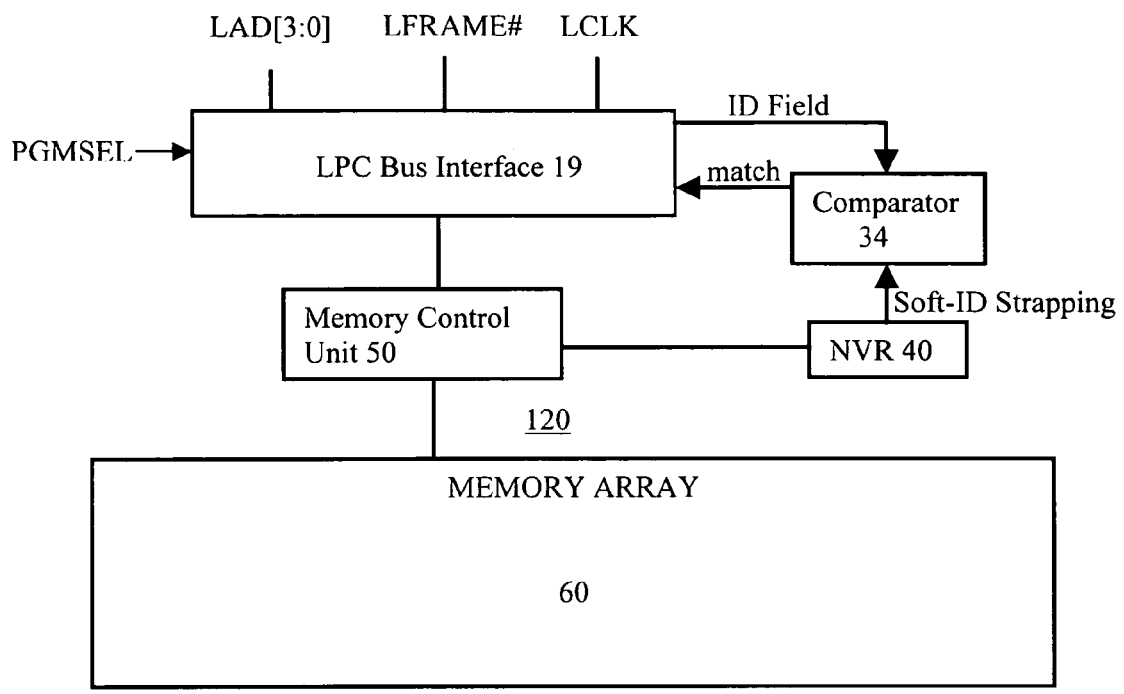
FIG. 5 is a detailed block diagram of a BIOS memory device of the present invention.

Referring to FIG. 5, there is shown a detailed block diagram of an improved BIOS memory device 120 of the present invention. Similar to the BIOS memory device 20 of the prior art, the improved BIOS memory device 120 can be an integrated circuit chip which is connected to an LPC bus 66 consisting of a LAD[3:0] bus supplying data/address/control signal fields, which are multiplexed, and the control signals LFRAME# and the clock signal of LCLK. The LPC bus signals are supplied to the LPC Bus Interface 19. From the LPC Bus Interface 19, the LPC bus signals are decoded to various LPC bus fields, which includes cycle type, size field, ID select field, control fields, address and data fields, etc. and are validated by the LPC Bus Interface logic 19 if the cycle type, size, ID select, control and address match with the valid values for the flash memory device. The invalid bus cycles are ignored by the LPC Bus Interface logic 19. The validated LPC Bus cycle fields are then supplied to a memory controller unit 50 which is connected to a memory array 60. These operations are not different from those of the prior art.

The improved BIOS memory chip 120 also comprises a non-volatile register (NVR) 40 which has stored therein a device ID strapping information. The contents of the NVR 40 are supplied to a comparator 34. In addition, the LPC Bus Interface 19 is also connected to the comparator 34 and the decoded ID select field output is compared with the ID strapping information stored in NVR 40 by comparator 34. The output of the comparator 34 feeds back to the LPC Bus Interface 19. If there is a miscompare (mismatch) between the contents of NVR 40 and the ID select filed decoding, the LPC bus cycle is invalid and the LPC Bus Interface 19 blocks the LPC Bus signals and fields from propagating to the memory control unit 50. In the preferred embodiment the non-volatile register 40 is one or more floating gate non-volatile flash memory cells. However, other types of non-volatile registers can also be used including but not limited to ROM, fuse, magnetic media, etc. In the preferred embodiment, the memory array 60 also comprises an array of non-volatile flash memory cells.

In the assembling of the motherboard 12, typically the BIOS memory chips 120, are first "loaded", i.e., programmed such that the memory array 60 is programmed with the BIOS program for the PC. This is typically done before each chip 120 is mounted onto the motherboard 12. In the process of programming the memory array 60 to contain the software for the BIOS program, the non-volatile register 40 is also loaded with the device ID for that improved memory BIOS chip 120. One method to program the non-volatile register 40 is to tie the optional PGMSEL pin to a particular voltage such as VCC or VSS, and to supply the device ID through the LAD[3:0] bus to the program circuit 50. The memory control unit 50 would then operate to program the non-volatile register 40. It should be noted that this is only one possible way in which the non-volatile register 40 may be programmed. The use of a PGMSEL pin, obviously, sacrifices another pin. However, other techniques to program the non-volatile register 40 may be through a series of particular order of bit patterns, known as a flash programming command, on the LAD[3:0] bus which would cause a control circuit to enter into the non-volatile register 40 programming mode. In the event the device 120 uses an extra pin such as the PGMSEL pin to program the non-volatile register 40, the PGMSEL pin may also be used for in-system programming via a jumper or driven by a GPIO of the chipset or embedded controller, once it is mounted on the motherboard 12.

Once the non-volatile register 40 is programmed with its unique device ID strapping information, the particular device 120 is then mounted on the motherboard 12 and in particular all the various signals such as the LAD[3:0] bus and the LFRAME# bus and the LCLK signals are connected to the LPC bus 66. As will be seen, since the device has already been programmed with the device ID, the particular order by which the devices 120 are mounted relative to one another on the motherboard 12 is irrelevant.

From the foregoing, it can be seen that an improved BIOS memory chip 120 has been disclosed which provides fewer pin counts, thereby saving costs in the manufacturing thereof and provides further flexibility in the placement of the chip on a motherboard.

What is claimed is:

1. An integrated circuit memory device comprising:
   a memory array;
   a non-volatile register for storing a stored signal, wherein the stored signal is alterable independently of values stored in the memory array;
   a bus connected to said device for supplying an externally supplied signal to said device; and
   a comparator for comparing the stored signal and the externally supplied signal and for providing access to said memory array for signals supplied on said bus in response to said comparison.

2. The device of claim 1 wherein said non-volatile register is a ROM device.

3. The device of claim 1 wherein said non-volatile register is a fuse device.

4. The device of claim 1 wherein said non-volatile register is a floating-gate memory cell.

5. The device of claim 1 wherein said comparator provides access to said memory array when said externally supplied signal matches said stored signal.

6. The device of claim 1 wherein said address bus operates in accordance with the LPC protocol.

7. The device of claim 1 wherein said memory array is an array of non-volatile flash memory array.

8. A low pin count integrated circuit memory device comprising:
   a memory array;
   a non-volatile register for storing a stored identification signal, wherein the stored identification signal is alterable independently of values stored in the memory array;
   a bus, connected to said device for supplying externally provided multiplexed data signals, address signals, and device identification signal to said device; and
   a comparator for comparing said stored identification signal and the externally provided device identification signal, and for providing said data signals and address signals to said array in the event of a match between said identification signal and said externally provided device identification signal.

9. The device of claim 8 wherein said non-volatile register is a ROM device.

10. The device of claim 8 wherein said non-volatile register is a fuse device.

11. The device of claim 8 wherein said non-volatile register is a floating-gate memory cell.

12. The device of claim 8 wherein said bus is operable in accordance with the LPC protocol.

13. The device of claim 8 wherein said memory array is an array of non-volatile flash memory array.

14. A memory unit comprising:
a plurality of like memory devices;
each memory device comprising:
- a memory array;
- a non-volatile register for storing a stored identification signal; wherein said identification signal stored in one memory device is different from an identification signal stored in another memory device, and wherein the stored identification signal is alterable independently of values stored in the memory array;
- a bus connected to said device for supplying externally provided data signals, address signals, and device identification signal to said device;
- a control circuit for receiving said stored identification signal and for providing said data signals and address signals to said memory array in the event of a match between said stored identification signal and said externally provided device identification signal; and
wherein said plurality of like memory devices have said bus connected in common.

15. The device of claim 14 wherein said non-volatile register is a ROM device.

16. The device of claim 14 wherein said non-volatile register is a fuse device.

17. The device of claim 14 wherein said non-volatile register is a floating-gate memory cell.

18. The device of claim 14 wherein said address bus operates in accordance with the LPC protocol.

19. The device of claim 14 wherein said memory array is an array of non-volatile flash memory array.

20. The device of claim 1, wherein an output of the comparator feeds back to a bus interface through which the comparator receives the externally supplied signal.

21. The device of claim 8, wherein an output of the comparator feeds back to a bus interface through which the comparator receives the externally supplied signal.

22. The device of claim 14, wherein an output of the comparator feeds back to a bus interface through which the comparator receives the externally supplied signal.

* * * * *